United States Patent
Patel et al.

(10) Patent No.: US 8,044,690 B2
(45) Date of Patent: Oct. 25, 2011

(54) SYSTEM AND METHOD FOR CLOCK-SYNCHRONIZED TRIANGULAR WAVEFORM GENERATION

(75) Inventors: Ketan B Patel, Lake Forest, CA (US);
Lorenzo Crespi, Costa Mesa, CA (US);
Lakshmi P Murukutla, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 31 days.

(21) Appl. No.: 12/574,663

(22) Filed: Oct. 6, 2009

(65) Prior Publication Data

US 2011/0080191 A1    Apr. 7, 2011

(51) Int. Cl.
*H03K 4/06* (2006.01)
(52) U.S. Cl. ....................................................... 327/131
(58) Field of Classification Search .................... 327/131
See application file for complete search history.

(56) References Cited

U.S. PATENT DOCUMENTS

| | | | |
|---|---|---|---|
| 4,284,906 A | 8/1981 | Manfredi | |
| 4,819,066 A | 4/1989 | Miyagi | |
| 6,297,693 B1 | 10/2001 | Pullen | |
| 6,828,753 B2 | 12/2004 | Grasso et al. | |
| 6,982,889 B2 | 1/2006 | Fukumoto | |
| 7,292,463 B2 | 11/2007 | Fukumoto | |
| 7,554,370 B2 | 6/2009 | Fukumoto | |
| 7,746,130 B2 * | 6/2010 | Chang | 327/131 |
| 2007/0171684 A1 | 7/2007 | Fukumoto | |
| 2008/0031028 A1 | 2/2008 | Fukumoto | |

OTHER PUBLICATIONS

Honda, Jun; Adams, Jonathan; "Application Note AN-1071, Class D Audio Amplifier Basics", International Rectifier, Feb. 8, 2005, pp. 1-14, El Segundo, California, United States of America.

* cited by examiner

*Primary Examiner* — Lincoln Donovan
*Assistant Examiner* — Daniel Rojas
(74) *Attorney, Agent, or Firm* — Jackson Walker L.L.P.; Christopher J. Rourk

(57) ABSTRACT

A triangular waveform generator is converted to a free running oscillator controlled by a calibration code. The free running oscillator can be synchronized to an external clock signal by comparing the external clock frequency to the frequency of the triangular waveform and adjusting the calibration code until the discrepancy in frequency is minimized.

23 Claims, 16 Drawing Sheets

SYSTEM AND METHOD FOR CLOCK-SYNCHRONIZED TRIANGULAR WAVEFORM GENERATION

BACKGROUND OF THE INVENTION

1. Field of the Invention

The present invention relates generally to pulse width modulation (PWM) and class-D amplifiers and specifically to clock-synchronized triangular waveform generators.

2. Related Art

Power delivery systems such as power amplifiers, switching voltage regulators, and electric motors often employ pulse-width modulation (PWM) to convey information or deliver power in an efficient manner. For example, class-D amplifiers employing PWM are used in powered audio devices due to their advantages in power consumption and size over traditional analog amplifiers. The improved power efficiency reduces the need for bulky heat sinks or advanced packaging, making class-D amplifiers more suitable for low-cost integrated circuits.

The class-D amplifier produces an output comprising a sequence of pulses. Pulse-width modulation is typically employed to encode audio information into these pulses by varying their individual widths. The average value of these pulses represents the instantaneous amplitude of the output signal. These pulses also introduce unwanted high-frequency content which may be removed by a low pass filter.

FIG. 1 is a block diagram illustrating the typical architecture of a class-D amplifier 100. The input signal is converted to pulses using modulator 102 which can be a pulse-width modulator. A common implementation of a pulse-width modulator uses a high-speed comparator to compare the input signal against a triangle wave. The modulated signal is then amplified by amplifier 104 and finally demodulated by low pass filter 106. The demodulated signal can then be used, for example by speaker 108.

FIG. 2 shows a typical PWM generator. Input reference signal 202 is compared by comparator 206 against a repetitive modulation source, such as a sawtooth or triangular waveform generated by ramp generator 204. When the input reference signal is greater than the modulation source, the signal level of PWM output signal 208 is high; when the input reference signal is less than the modulation source, the signal level of PWM output signal 208 is low.

In communication systems using class-D audio amplifiers, PWM performance is optimized for peak amplifier linearity. For a given modulation frequency, PWM performance is improved when the modulating source is a triangular waveform instead of a sawtooth. FIG. 3A shows traces of the signals related to a PWM generator using a sawtooth waveform. Graph 302 shows the sawtooth modulation source superimposed on the input reference signal. Graph 304 shows the resultant PWM output signal. FIG. 3B shows traces of the signals related to a PWM generator using a triangular waveform. Graph 312 shows the triangular modulation source superimposed on the input reference signal. Graph 314 shows the resultant PWM output signal. Because reference information is encoded on both the rising and falling edges of PWM signal 314, as opposed to only one edge of PWM signal 304 when a sawtooth modulating source is employed, a triangular waveform is a preferable modulation source.

In a typical class-D audio amplifier system, the input audio signal is an analog waveform reconstructed from digital samples. In order to reduce spectral folding and aliasing issues, it is desirable to have the triangular waveform synchronized to a frequency related to the sampling clock. Usually the sampling clock is a divided down version of a master clock. To avoid the aforementioned issues, the triangular waveform should be synchronized to another clock that is also divided down from the same master clock.

Other challenges with the design of a synchronized triangular waveform generator include drift due to the triangle wave not returning to the same voltage level after each clock cycle, synchronization where the triangle waveform frequency does not match the clock rate of a given input clock, and linearity in either the upward ramp or downward ramp of the triangle waveform. Therefore, there is a need in the industry for an inexpensive and improved clock-synchronized triangular waveform generator.

SUMMARY OF INVENTION

In a pulse modulator, a calibrated synchronized triangular waveform generator has a triangular waveform generator, a digital pulse generator which generates a square wave clock signal with essentially the same frequency as the generated triangle waveform, and a calibration circuit. During a calibration phase, the clock signal produced by the digital pulse generator is compared with an external clock signal and the triangular waveform generator is adjusted by the calibration circuit until the generated clock signal matches as close as possible to the external clock signal.

The calibrated synchronized triangular waveform generator can further include a clock selection circuit which selects the clock signal generated during calibration and the external clock signal at other times, with the selected clock signal fed back to the triangular waveform generator. One embodiment of the digital pulse generator has two comparators and an RS latch. After calibration the digital pulse generator and the calibration circuit can be deactivated to save power. The calibration circuit can have a rate comparison circuit and a successive-approximation-register (SAR) logic block for adjusting the calibration code used by the triangular waveform generator. The triangular waveform generator can have a rising sawtooth waveform generator and a falling sawtooth waveform generator with complementary switching circuits that alternatively select the rising sawtooth waveform and the falling sawtooth waveform to generate the triangular waveform.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

A detailed description of embodiments of the present invention is presented below. While the disclosure will be described in connection with these drawings, there is no intent to limit it to the embodiment or embodiments disclosed herein. On the contrary, the intent is to cover all alternatives, modifications, and equivalents included within the spirit and scope of the disclosure.

Figure 1:
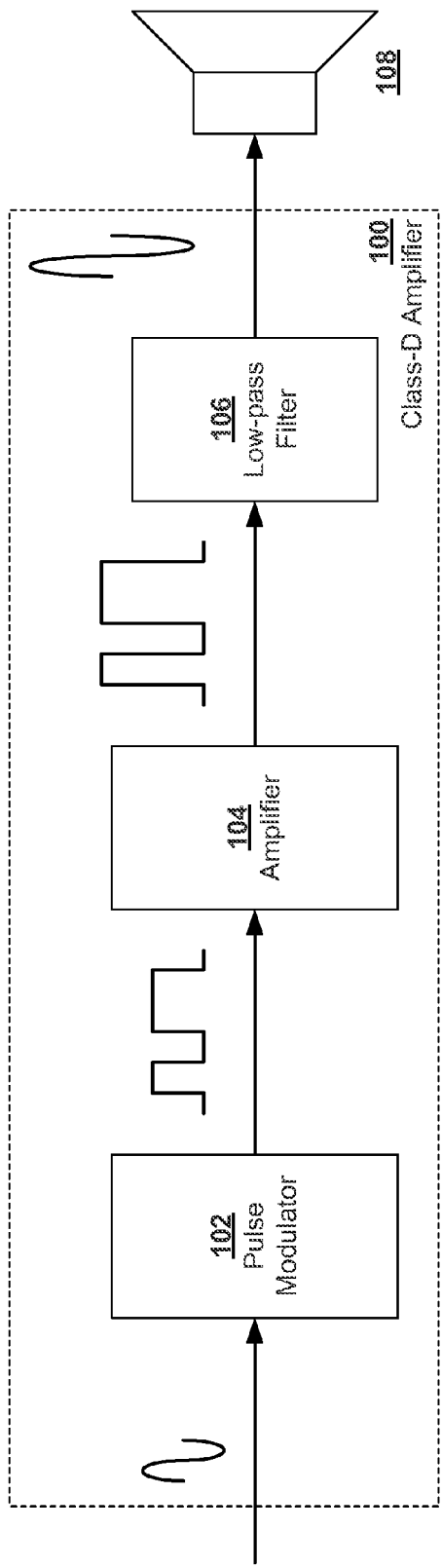
FIG. 1 is a block diagram illustrating the typical architecture of a class-D amplifier.
Figure 2:
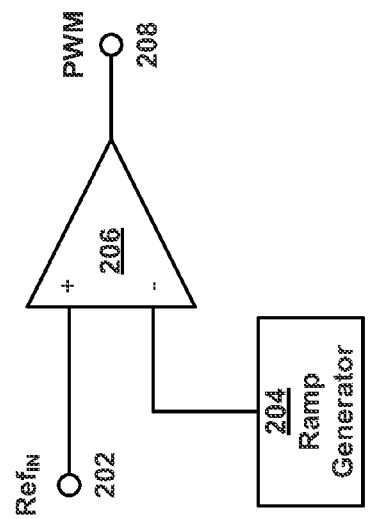
FIG. 2 shows a typical PWM generator.
Figure 3A:
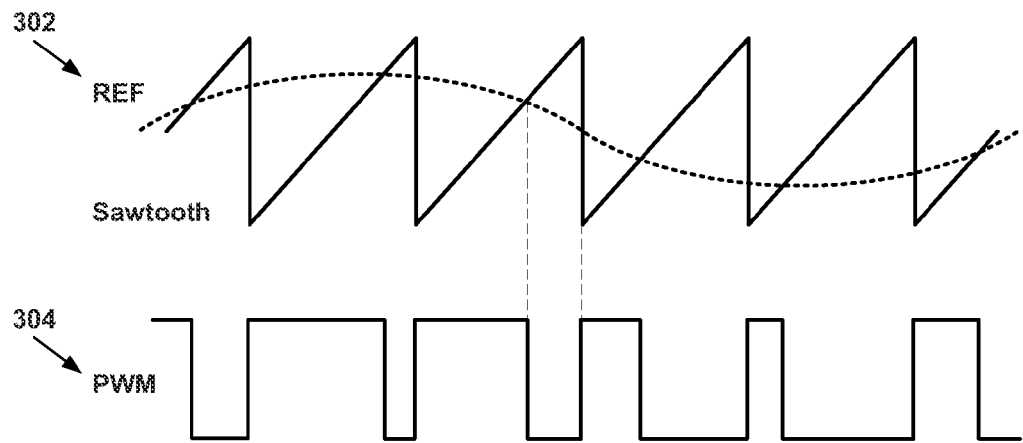
FIG. 3A shows traces of the signals related to a PWM generator using a sawtooth modulation waveform.
Figure 3B:
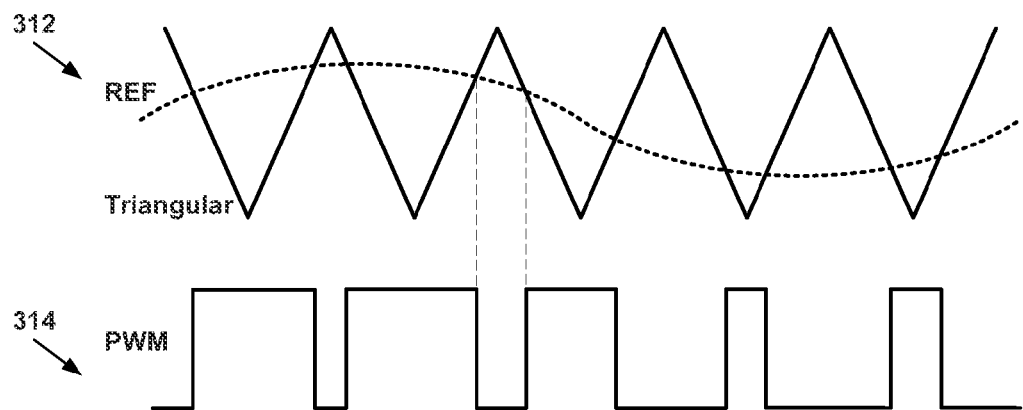
FIG. 3B shows traces of the signals related to a PWM generator using a triangular modulation waveform.
Figure 5:
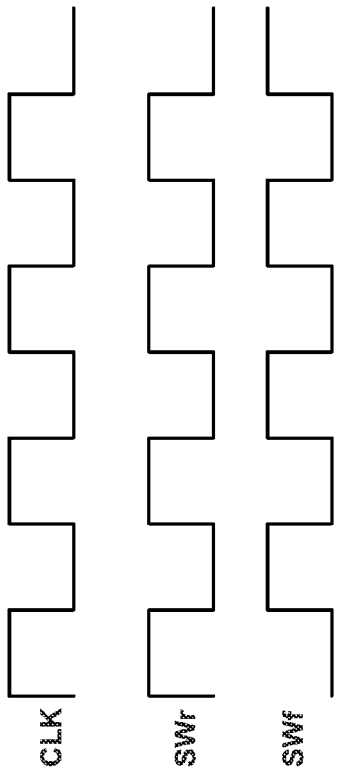
FIG. 5 shows a relation between the modulation clock and the switch control signals in the synchronized triangular waveform generator of FIG. 4.
Figure 4:
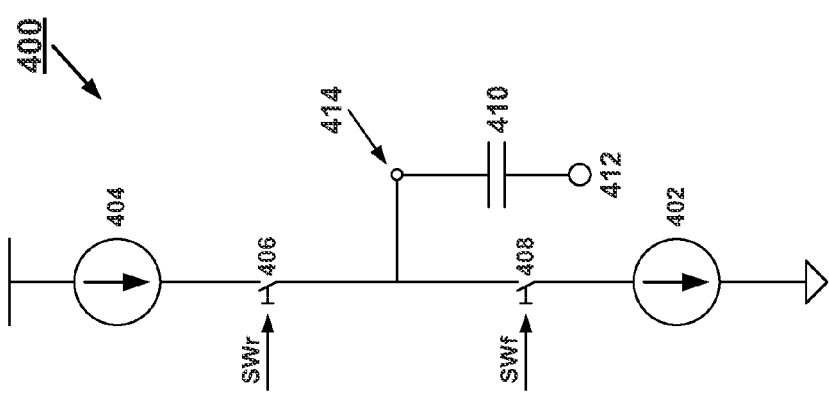
FIG. 4 shows a synchronized triangular waveform generator.

FIG. 4 shows a synchronized triangular waveform generator. Triangular waveform generator 400 comprises fixed current source 402, fixed current source 404 and capacitor 410. Waveform generator 400 also comprises complementary switching circuits shown in this example by switch 406 and switch 408 which are switched in a complementary fashion such that when switch 406 is open, switch 408 is closed, and vice versa. A bias voltage is applied at 412 to triangular waveform generator 400. Switch 406 is controlled by signal SWr and switch 408 is controlled by signal SWf. As shown in FIG. 5, switch 406 is synchronized to a modulation clock signal such that when the clock signal is high switch 406 is closed and when the clock signal is low switch 406 is opened. Complementary switch 408 is opened when the clock signal is high and closed with the clock signal is low.

When switch 406 is closed and switch 408 is open, current source 404 charges capacitor 410 linearly until the next clock transition. When the clock goes low, switch 408 closes and switch 406 opens, allowing current source 402 to discharge capacitor 410 linearly. With substantially equal charge and discharge times (i.e. the modulation clock has a 50% duty-cycle) and matched current sources (the current drawn by current source 402 is the same as the current driven by current source 404), the voltage at node 414 is bounded between a peak ramp voltage $V_{RAMP\_H}$ and the bias voltage $V_{BIAS}$.

Figure 6:
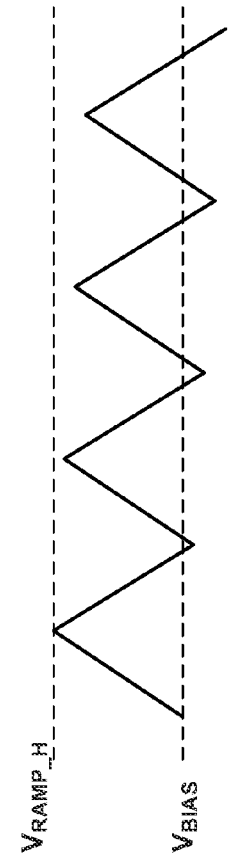
FIG. 6 shows the case of voltage drift due to circuit non-idealities.

Imperfections in clock or switch timing or current source magnitudes can result in an undesirable mismatch between the charge transferred during the "charge" and "discharge" phases. For example, a charge error generated each clock period can accumulate over time resulting in a voltage drift towards one of the power rails and an eventual saturation. FIG. 6 shows the case where the discharging current is slightly greater than the charging current, which causes the slope of the falling phase to be slightly greater than the slope of the rising phase. The ramp voltage drifts lower over each clock period, causing the waveform's common-mode voltage to vary over time. For proper operation using this arrangement a correction scheme to manage this drift may be used.

Figure 7:
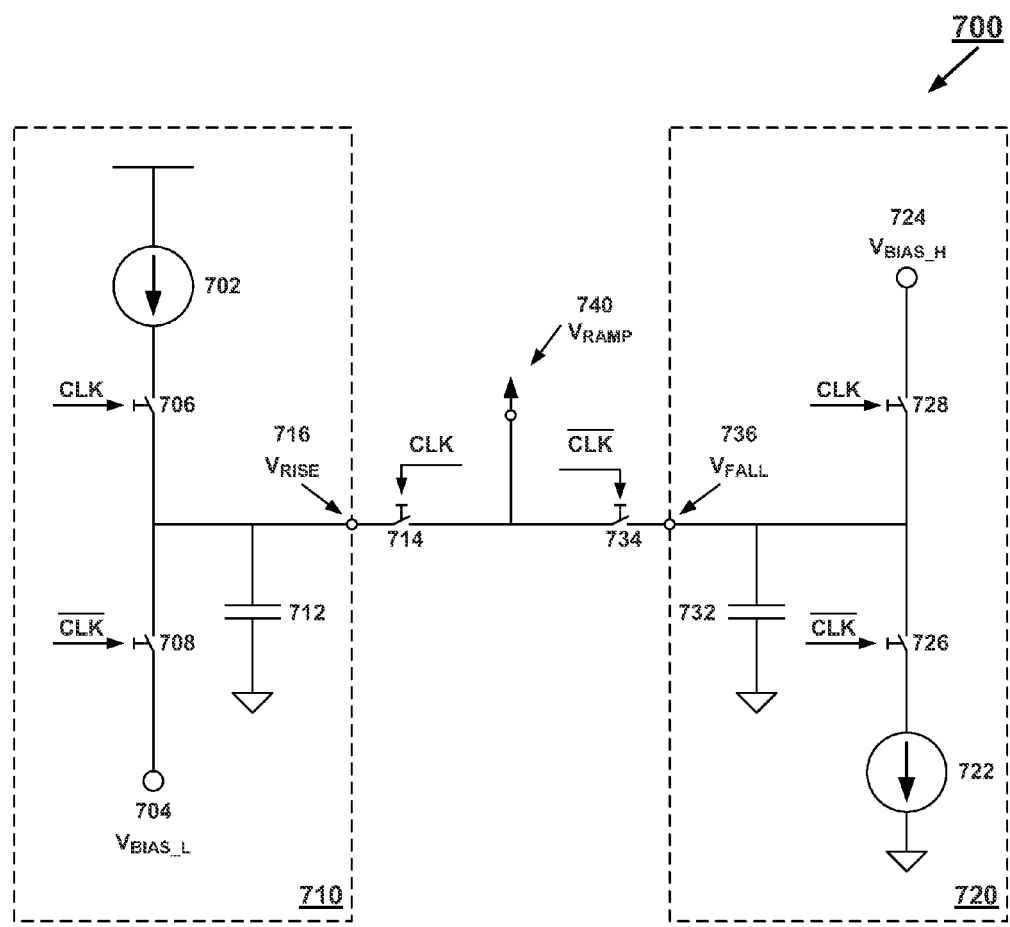
FIG. 7 shows an embodiment of a synchronized triangular waveform generator which does not have voltage drift.

FIG. 7 shows an embodiment of a synchronized triangular waveform generator which doesn't have the drift issue described previously. Waveform generator 700 employs two circuits, a rising sawtooth generator 710 and a falling sawtooth generator 720, to generate separate rising and falling sawtooth waveforms. Each sawtooth generator is alternately connected to output 740 through switch 714 and switch 734, respectively, to capture the rising and falling edges to form a triangular waveform. Therefore, the voltage $V_{RAMP}$ seen at output 740 is the rising voltage $V_{RISE}$ at output node 716 generated by rising sawtooth generator 710 when switch 714 is closed and is the falling voltage $V_{FALL}$ at output node 736 generated by falling sawtooth generator 720 when switch 734 is closed. Switch 714 is controlled by a clock signal CLK and complementary switch 734 is controlled by the inverted clock signal $\overline{CLK}$.

Rising sawtooth generator 710 comprises current source 702, complementary switches 706 and 708, and capacitor 712, and is coupled to low bias voltage $V_{BIAS\_L}$ at 704. When switch 706 is closed and switch 708 is opened, the voltage at node 716 rises linearly from the low bias voltage due to current source 702 charging capacitor 712. This generates the linear rising portion of the triangle wave seen at output 740. When switch 708 is closed and switch 706 is opened, capacitor 712 is pre-charged back to the bias voltage $V_{BIAS\_L}$. During this pre-charge portion of the rising sawtooth generator's cycle, node 716 is disconnected from output 740 by switch 714.

Similarly, falling sawtooth generator 720 comprises current source 722, complementary switches 726 and 728, and capacitor 732, and is coupled to high bias voltage $V_{BIAS\_H}$ at 724. When switch 726 is closed and switch 728 is opened, the voltage at node 736 falls linearly from the high bias voltage due to current source 722 discharging capacitor 732. This generates the linear falling portion of the triangle wave seen at output 740. When switch 728 is closed and switch 726 is opened, capacitor 732 is pre-charged back to the bias voltage $V_{BIAS\_H}$. During this pre-charge portion of the falling sawtooth generator's cycle, node 736 is disconnected from output 740 by switch 734.

While wave generator 700 does not suffer the drawback of voltage drift since the capacitors are pre-charged to fixed voltages each cycle, there may be voltage discontinuities. Unlike the voltage drift problems discussed with reference to FIG. 4, errors from such discontinuities in wave generator 700 do not accumulate or grow over time as it does in waveform generator 400.

Figure 8:
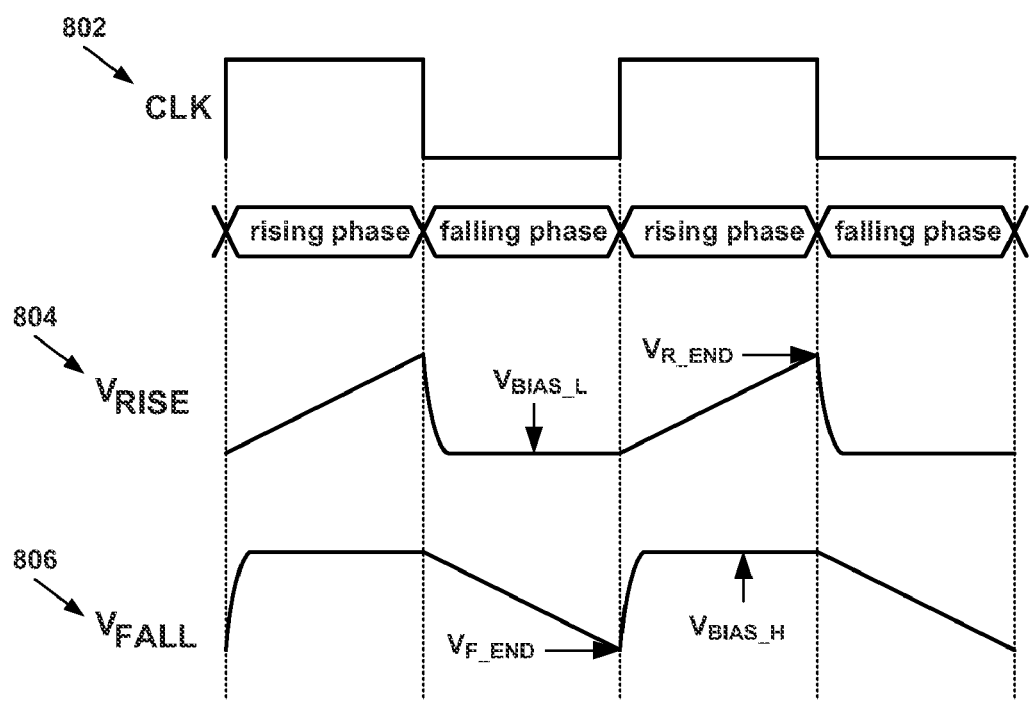
FIG. 8 shows the signaling of the two sawtooth generators.

FIG. 8 shows the signaling at nodes 716 ($V_{RISE}$) and 736 ($V_{FALL}$). Graph 802 shows the clock signal. Graph 804 shows the voltage trace at node 716 and graph 806 shows the voltage trace at node 736. The voltage $V_{RISE}$ rises from $V_{BIAS\_L}$ up to $V_{R\_END}$, while the voltage $V_{FALL}$ falls from $V_{BIAS\_H}$ down to $V_{F\_END}$. Since it is desirable to have a triangular wave with no discontinuities at the boundary between the rising and falling phases, constraints on the ramp slope (set by current sources and capacitors) and the ramp amplitude (set by the bias voltages $V_{BIAS\_H}$ and $V_{BIAS\_L}$) are established. Specifically $V_{R\_END}$ should equal $V_{BIAS\_H}$ and $V_{F\_END}$ should equal $V_{BIAS\_L}$.

In order to set the ramp slope properly, the relationship between the ramp phases and the bias voltages is determined. During a ramp phase a capacitor is either being charged or discharged by a constant current source. The voltage change across this capacitor can be written as:

$$\Delta V_C = \frac{I_{DC}}{C}\Delta t = m_{ramp}\Delta t,$$

where the ramp slope is defined as $$m_{ramp} = \frac{I_{DC}}{C},$$

$I_{DC}$ is the current supplied by the current source, and C is the capacitance of the capacitor in each sawtooth generator. Since each charging or discharging phase lasts for half a clock period and the voltage swing is set by $V_{BIAS\_H}$ and $V_{BIAS\_L}$, the following constraint between the ramp slope and the voltage swing is derived:

$$V_{BIAS\_H} - V_{BIAS\_L} = \Delta V_C = m_{ramp}\frac{T_{CLK}}{2} = \frac{m_{ramp}}{2f_{CLK}}$$

If the previous relationship holds, then there will be no discontinuities in the triangular waveform. However in practice the design variables are not perfectly controlled or fixed. For example, the clock frequency $f_{CLK}$ can have a an error, or the system designer may want flexibility in setting the frequency, in which case the ramp discontinuities would increase as the clock frequency deviates from the nominally assumed value. Even if the clock frequency is fixed and ideally known, process and temperature variations in either the ramp slope or the bias voltages can cause large discontinuities.

In order to generate process and temperature independent bias voltages, in one embodiment bias voltages $V_{BIAS\_H}$ and $V_{BIAS\_L}$ are created by forcing a DC current through a string of on-chip resistors. The resulting bias voltage is $V_{BIAS}=I_{BIAS}R$, where R is the resistance of the on-chip resistors. If $I_{BIAS}$ is a current source that is made inversely proportional to the on-chip resistance, the resistance variations cancel out and the bias voltage can be made insensitive to process and temperature variations. Since the triangle wave oscillates between the two bias voltages, the ramp amplitude is consequently also made process and temperature independent.

Previously the ramp slope was defined to be $$m_{ramp} = \frac{I_{DC}}{C};$$

hence the ramp slope is inversely proportional to on-chip resistance (via the inverse relationship to $I_{DC}$) and the on-chip capacitor. Typical semiconductor processes will have resistors that exhibit process variations in the 20-30% range. Since on-chip capacitor variation is in general not well correlated with resistance, the process variations will not cancel one another and the ramp slope will exhibit a large variation.

Figure 9:
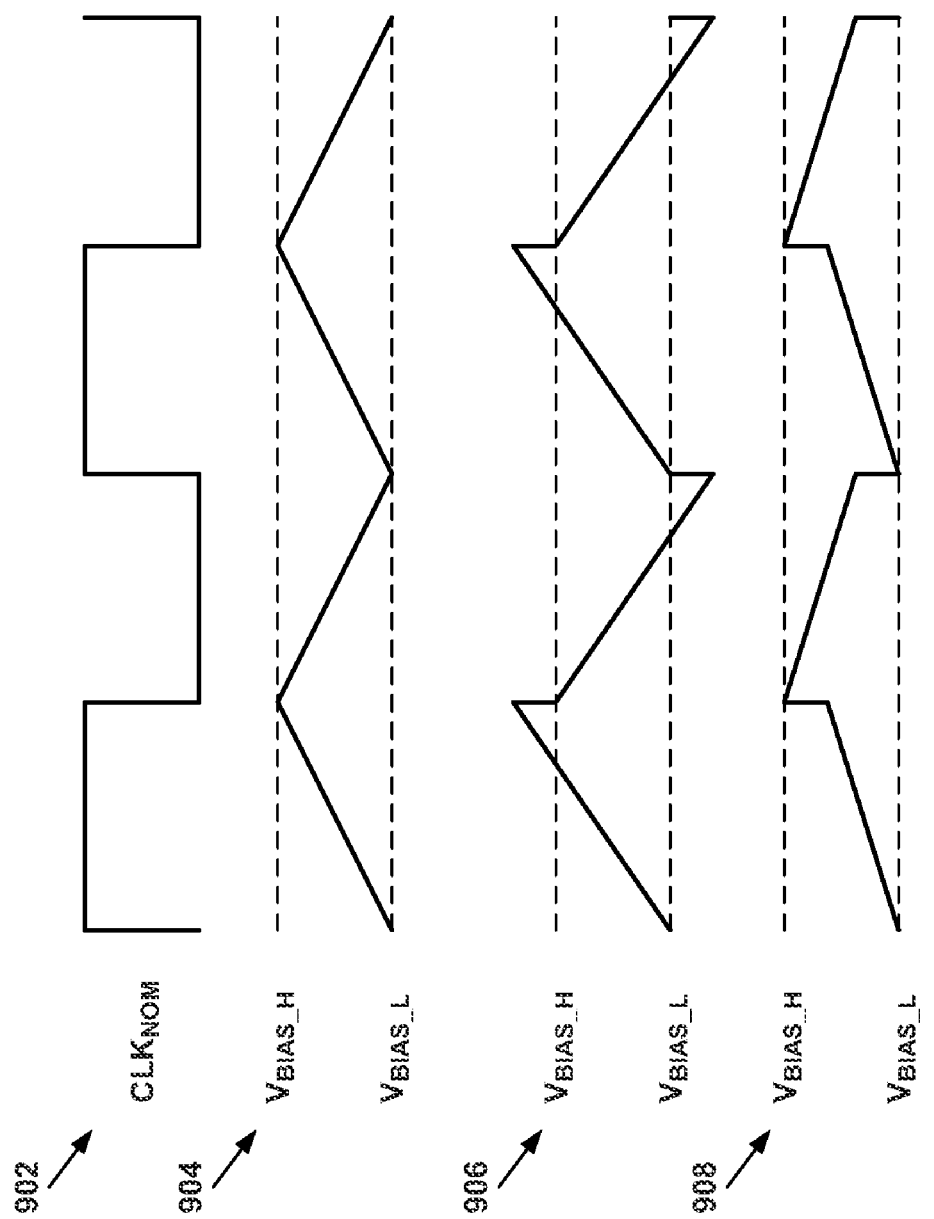
FIG. 9 shows the effect of process variation on the ramp signal while maintaining a nominal clock frequency.

FIG. 9 shows an embodiment of the effect of process variation on the ramp signal while maintaining a nominal clock frequency. Trace 902 shows a nominal clock signal. Trace 904 is an ideal nominal case ramp signal while trace 906 and trace 908 are fast and slow process corners, respectively. In the fast corner, on-chip resistance is lower than nominal. Since it was previously shown that ramp slope is inversely proportional to resistance, in the fast corner the ramp slope is greater than nominal and trace 906 shows a large overshoot. In the slow corner, the resistance is larger than nominal and the resulting ramp slope is too low; this condition results in trace 908.

Figure 10:
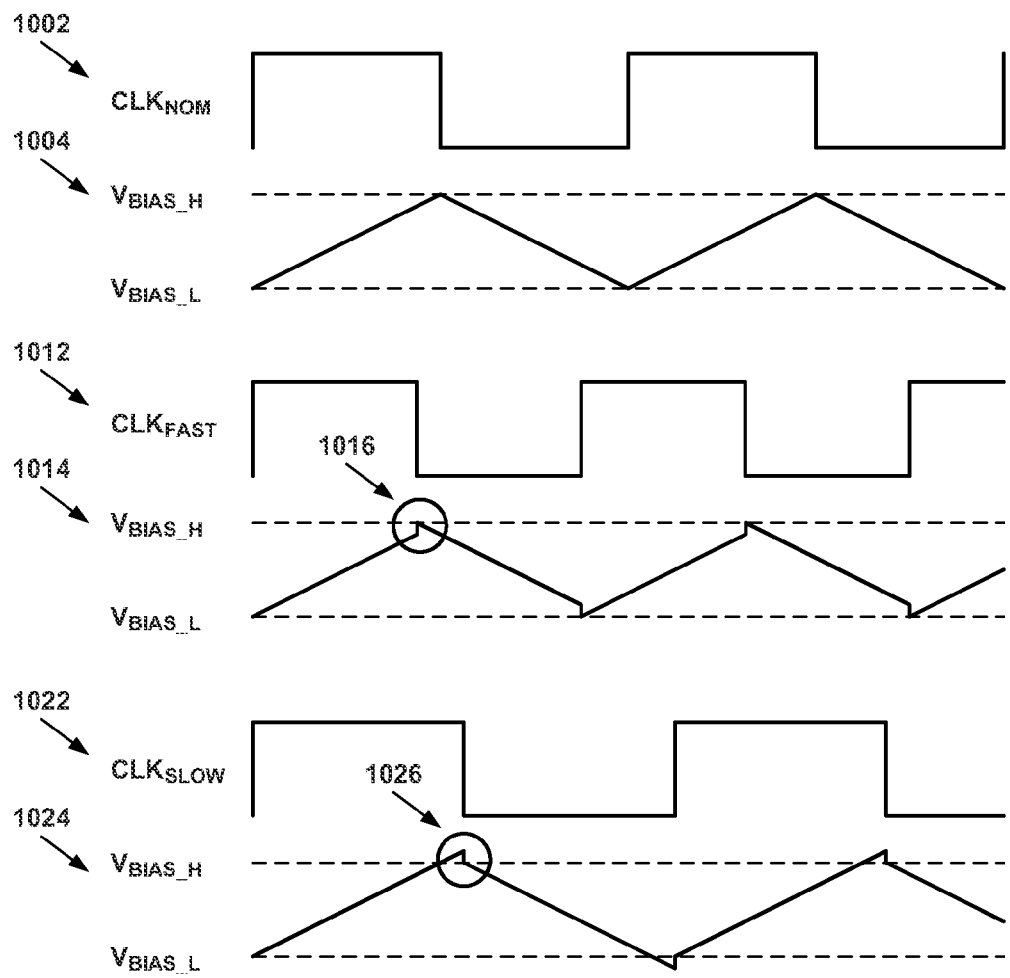
FIG. 10 shows the effect of errors between the clock frequency and the nominal ramp slope.

FIG. 10 illustrates an embodiment in which errors between the clock frequency and the ramp slope result in similar discontinuities in the triangular waveform. Trace 1002 shows a nominal clock and trace 1004 shows the resultant ramp waveform where the ramp slope is matched to the clock frequency. Trace 1012 shows a clock signal running faster than the nominal clock shown in trace 1002, and trace 1014 is the resultant ramp waveform. Since the ramp slope was optimized for the nominal clock frequency, the slope is too low for the faster clock and the capacitor voltage won't reach the proper final voltage when the next ramp phase is initiated. This causes the voltage "jump" seen in circled region 1016. Trace 1022 shows a clock signal running slower than the nominal clock shown in trace 1002, and trace 1024 shows the resultant ramp waveform. In this case the ramp slope is too high and the ramp voltage overshoots the bias levels. Circled region 1026 shows a "jump" in the waveform.

Figure 11:
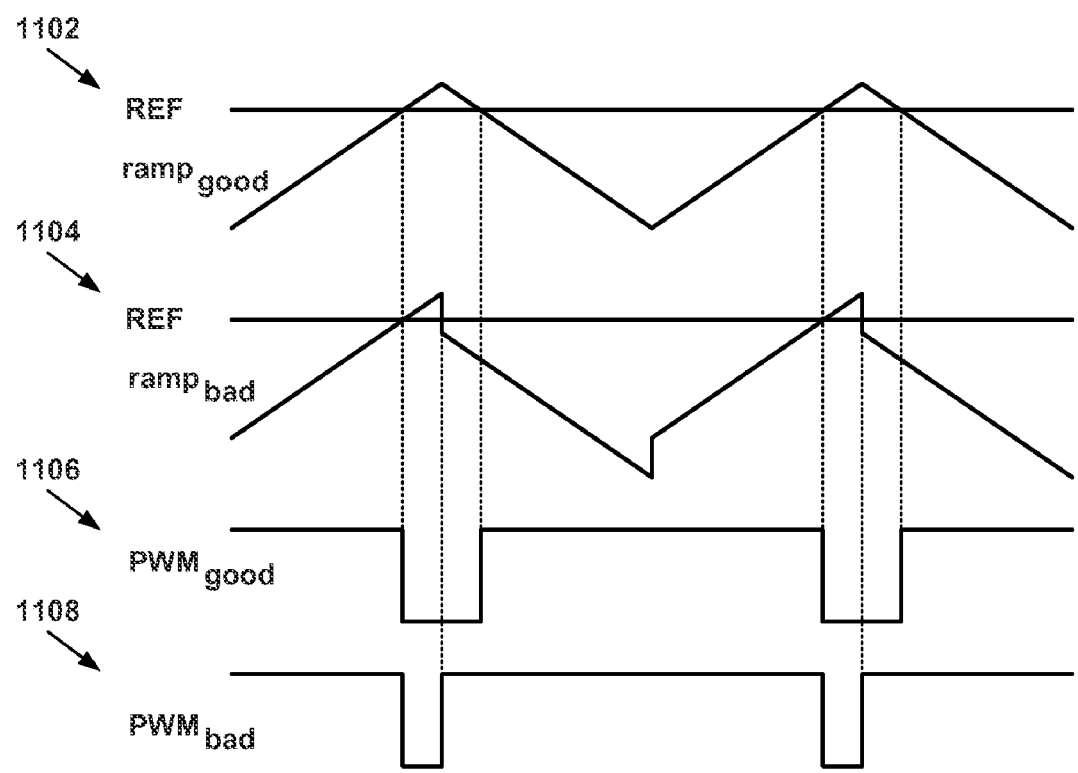
FIG. 11 diagrams how discontinuities in the triangular waveform can result in PWM errors.

Ramp discontinuities can cause errors in the PWM generation, which can reduce system performance. FIG. 11 diagrams how discontinuities in the triangular waveform can result in PWM errors. Graph 1102 shows an ideal triangular ramp waveform while graph 1104 shows a triangular ramp with a large voltage discontinuity at the ramp peaks. Graph 1106 shows the PWM signal resulting from the ideal triangular waveform and graph 1108 shows the PWM signal resulting from the triangular waveform with discontinuities which causes the PWM's rising edge to occur too soon. In applications such as class-D amplifiers where signal integrity is important across large modulation ranges (e.g., modulation indexes approaching 100%), timing errors such as these result in a dramatic loss of linearity.

Figure 12:
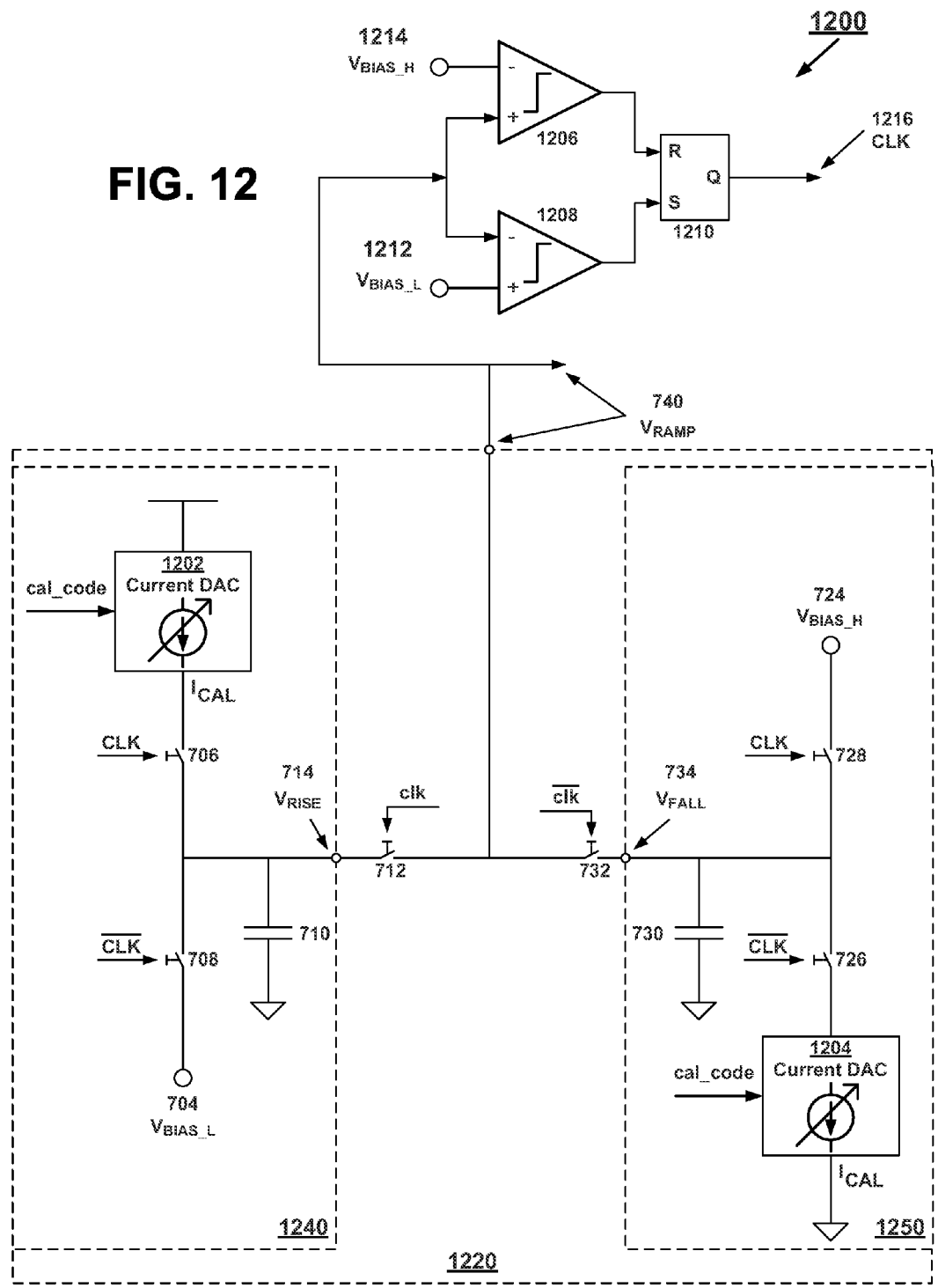
FIG. 12 is a self-oscillating triangle wave generator.

FIG. 12 is an embodiment of a programmable-frequency self-oscillating triangle wave generator 1200 using the basic architecture of triangle wave generator 700. The wave generator 1200 comprises triangle wave generator 1220, comparator 1206, comparator 1208, and RS latch 1210. Triangle wave generator 1220 comprises a rising sawtooth generator 1240 and a falling sawtooth generator 1250. Rising sawtooth generator 1240 is coupled to $V_{BIAS\_L}$ at 704 and comprises switch 706, switch 708, and capacitor 710. Falling sawtooth generator 1250 is coupled to $V_{BIAS\_H}$ at 724 and comprises switch 726, switch 728, and capacitor 730. The rising sawtooth generator 1240 and the falling sawtooth generator 1250 are alternatively coupled to output 740 of triangle wave generator 1220 via complementary switches 712 and 732. Triangle wave generator 1220 differs from triangle wave generator 700 in that adjustable current source 1202 replaces current source 702 and adjustable current source 1204 replaces current source 722. In one embodiment, the adjustable current sources are implemented using a current DAC which receives a digital value cal_code and produces a current ICAL based on the digital value.

Comparators 1206 and 1208 combined with latch 1210 are essentially an exemplary embodiment of a digital pulse generator that generates a clock signal with essentially the same frequency as the triangular waveform generated at the output. Comparator 1206 compares the output voltage $V_{RAMP}$ against high bias voltage $V_{BIAS\_H}$ supplied at 1214, and comparator 1208 compares the output voltage $V_{RAMP}$ against low bias voltage $V_{BIAS\_L}$ supplied at 1212. When $V_{RAMP}$ reaches $V_{BIAS\_H}$, comparator 1206 sends a high signal to the "reset" input of RS latch 1210 forcing the latch to generate a low signal. When $V_{RAMP}$ falls to $V_{BIAS\_L}$, comparator 1208 sends a high signal to the "set" input of RS latch 1210 forcing the latch to generate a high signal. Output 1216 of RS latch 1210 is used as a clock to operate the switches in triangle wave generator 1220.

Figure 13:
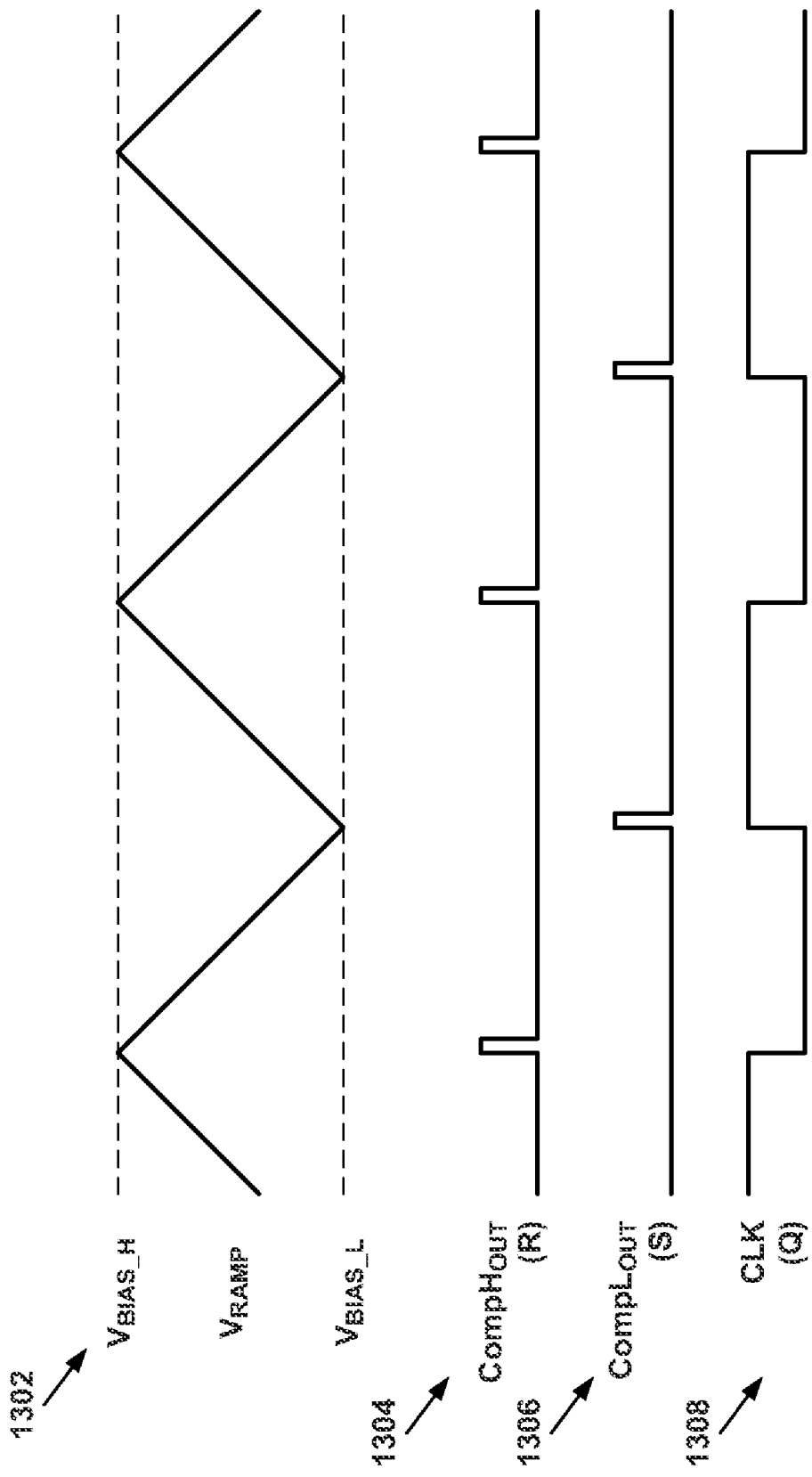
FIG. 13 shows an example of the signaling of a self-oscillating triangle wave generator.

FIG. 13 shows an example of the signaling of self-oscillating triangle wave generator 1200. It shows the $V_{RAMP}$ signal shown as trace 1302 in relationship to the outputs of comparator 1206 (CompH$_{OUT}$) shown as trace 1304 and comparator 1208 (CompL$_{OUT}$) shown as trace 1306 as well as to the RS latch 1210 output (CLK) shown as trace 1308. When the clock signal is high, the rising sawtooth generator 1240 causes $V_{RAMP}$ to rise. When $V_{RAMP}$ reaches $V_{BIAS\_H}$, CompH$_{OUT}$ goes high causing RS latch 1210 to force CLK low. When the clock goes low, the switches in triangle wave generator 1220 connect the falling sawtooth generator 1250 to output 740, causing $V_{RAMP}$ to fall linearly until $V_{RAMP}$ reaches $V_{BIAS\_L}$. When $V_{RAMP}$ reaches $V_{BIAS\_L}$, CompL$_{OUT}$ goes high causing RS latch 1210 to force CLK high. This causes the switches in triangle wave generator 1220 to connect rising sawtooth generator 1240 to output 740 and the process thus repeats.

In this embodiment, self-oscillating triangle wave generator 1200 generates a triangle wave with minimal, if any, discontinuity. The slope of the rising and falling segments of the triangle waveform is directly proportional to the DC current applied to the capacitors, i.e. increasing the DC current results in the slope increasing. If the slope of $V_{RAMP}$ were increased, the period between threshold crossings would decrease proportionally. Thus the frequency of the ramp and associated clock will also increase. The opposite occurs if the DC current is decreased. Lower DC current causes lower ramp slope, which results in a longer ramp period or lower frequency. Since self-oscillating triangle wave generator 1200 is effectively a programmable oscillator, $I_{CAL}$ can be calibrated to the appropriate current level needed to match the wave generator's frequency to a desired incoming clock frequency.

Figure 14:
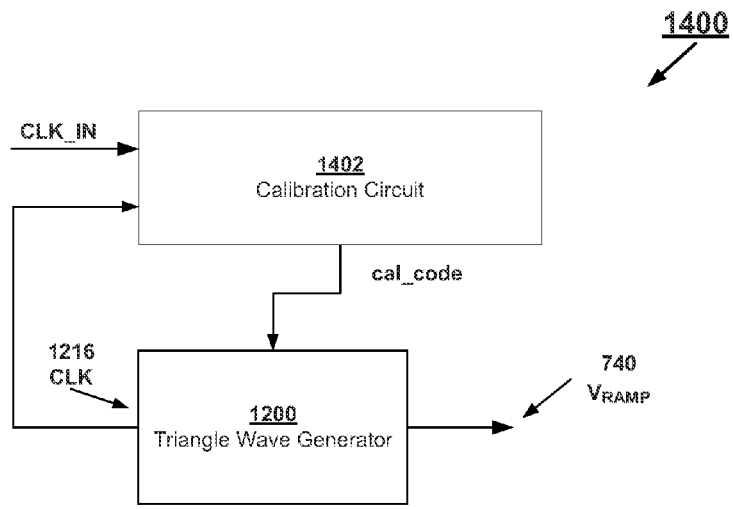
FIG. 14 shows an embodiment of a triangle wave generator with calibration.

FIG. 14 shows an embodiment of a triangle wave generator with calibration. A triangle wave generator 1400 comprises self-oscillating triangle wave generator 1200 and calibration circuit 1402. Calibration circuit 1402 receives clock signal CLK 1216 from wave generator 1200 and synchronization clock signal CLK_IN. By measuring the differences between CLK and CLK_IN, calibration circuit 1402 adjusts the frequency of wave generator 1200 to match CLK_IN by altering the DC current supplied by current sources 1202 and 1204. In one embodiment, calibration circuit 1402 operates using a feedback mechanism that attempts to force CLK to match CLK_IN.

Figure 15:
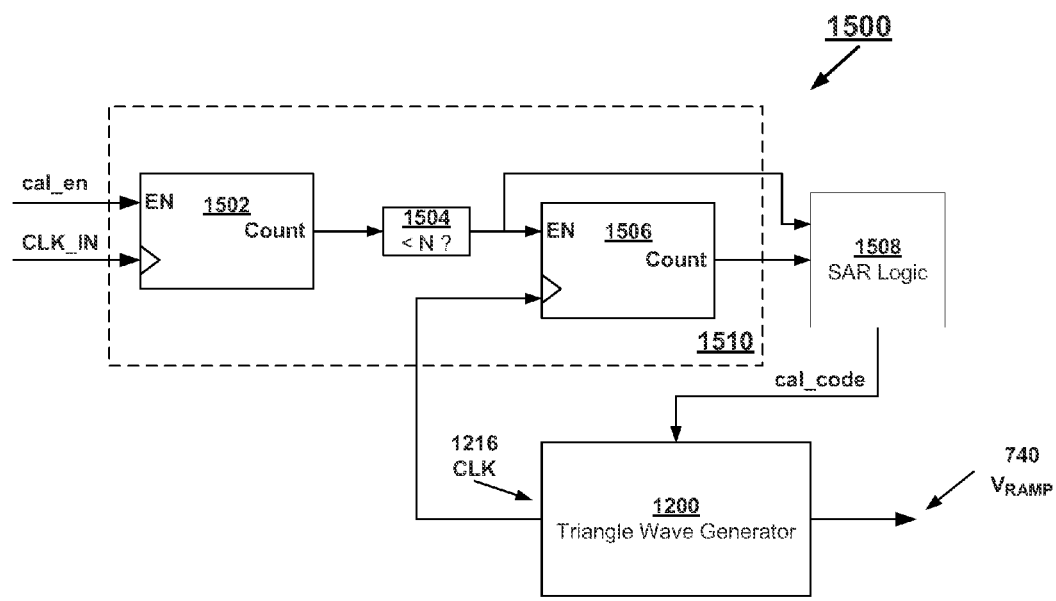
FIG. 15 shows an embodiment of a triangle wave generator with an example of a calibration circuit.

FIG. 15 shows an embodiment of a triangle wave generator with an example calibration circuit. In this embodiment, triangle wave generator 1500 comprises a calibration circuit with rate comparison circuit 1510 and successive-approximation-register (SAR) logic 1508. Comparison circuit 1510 comprises reference counter 1502, comparison circuit 1504, and ramp counter 1506. Reference counter 1502 counts CLK_IN clock cycles and ramp counter 1506 counts CLK clock cycles. Comparison circuit 1504 in conjunction with reference counter 1502 acts as a timer to enable ramp counter 1506 for N periods of the CLK_IN signal, so that after N periods a determination can be made as to whether the CLK signal has a higher or lower frequency than the CLK_IN signal. If fewer than N cycles of the CLK signal are counted after N periods of the CLK_IN signal are counted, then the CLK signal has a lower frequency than the CLK_IN signal. Similarly, if the count determined by ramp counter 1506 is greater than N at the end of N periods of the CLK_IN signal, then CLK has a higher frequency than the CLK_IN signal. SAR logic 1508 uses this information to adjust the CLK signal.

Figure 16:
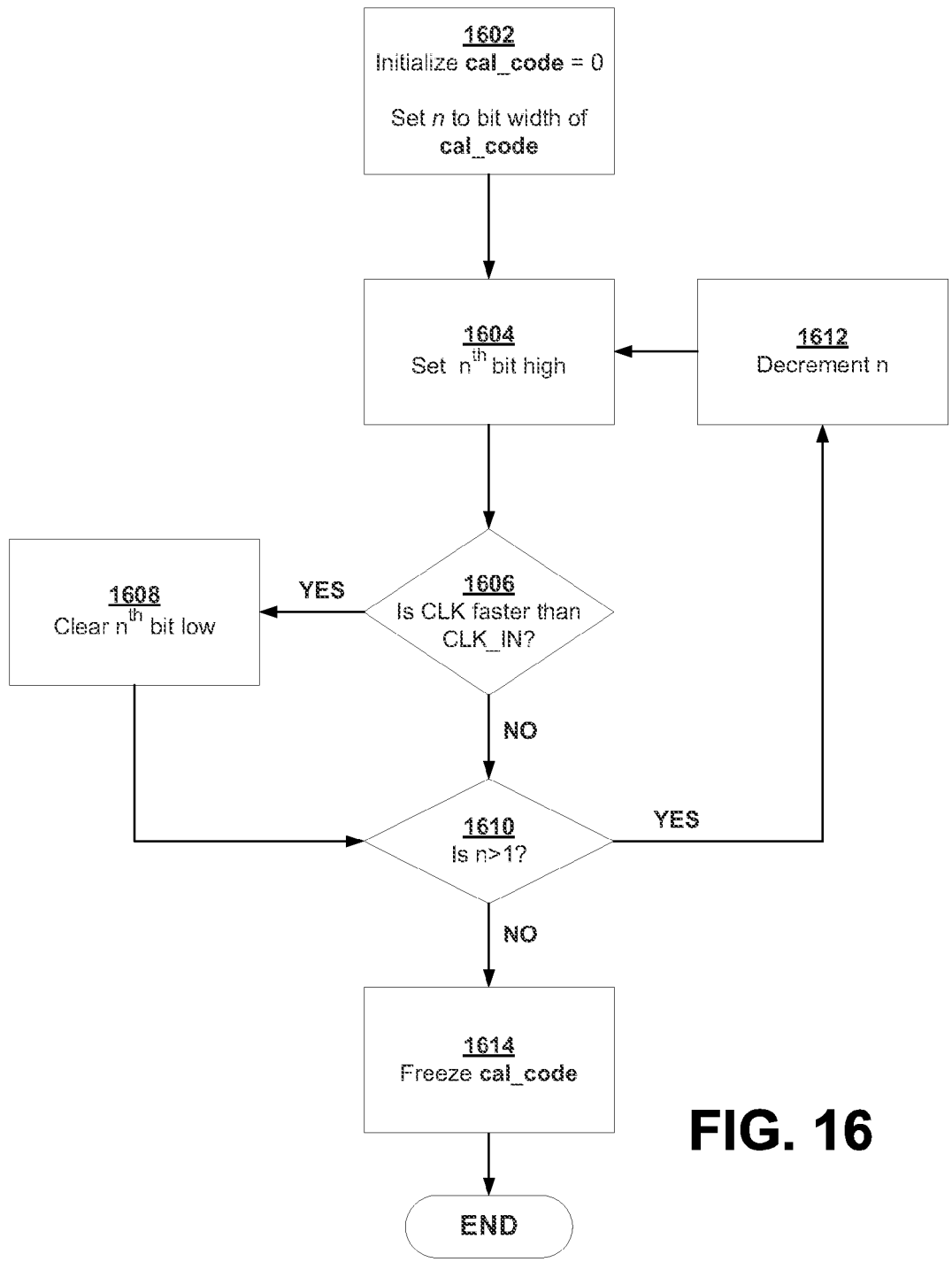
FIG. 16 shows a flowchart of the operation of the SAR logic block.

In one embodiment, SAR logic 1508 determines the calibration value "cal_code" which results in a CLK signal which most closely matches the CLK_IN signal in frequency. FIG. 16 is a flowchart illustrating an embodiment of the operation of the SAR logic block. At step 1602, a binary search is initialized by setting cal_code to all zeros and setting n equal to B, the number of bits in cal_code. At step 1604, the n$^{th}$ bit of cal_code is set to 1. At step 1606, a determination is made as to whether CLK is faster than CLK_IN. This can be performed by rate comparison circuit 1510. If true, the n$^{th}$ bit of cal_code is reset to 0 at step 1608 and then step 1610 is executed. If at step 1606 the CLK signal is slower than the CLK_IN signal, the n$^{th}$ bit is left high and step 1610 is executed. At step 1610, a determination is made as to whether n is greater than 1, i.e. the process has reached the lowest bit of cal_code. If n is greater than 1, n is decremented at step 1612 and the process repeats on the next significant bit by returning to step 1604. If at step 1610 n is not greater than 1, the calibration operation is complete and the cal_code value which yields the closest frequency match between CLK and CLK_IN has been found and is frozen by the SAR logic block at step 1614.

In order to obtain an accurate comparison, N should be greater than $2^B$. To demonstrate this process, suppose cal_code is a six-bit code such that B=6. Because N should be greater than $2^6$=64, a choice of N=128 is convenient. The process begins by setting cal_code to [100000]. Assuming that this code yields a CLK frequency that is higher than CLK_IN's frequency (i.e., the output of ramp counter 1506 is greater than 128), then the highest bit is cleared, i.e. cal_code=[000000]. Note that bits in bold text designate code bits that have been determined and are fixed for the remainder of the calibration procedure. On the next iteration, the 5$^{th}$ bit is set high and cal_code=[010000]. Suppose that this code yields a CLK frequency that is lower than CLK_IN's frequency; the 5$^{th}$ bit then remains set high. On the next iteration, the 4$^{th}$ bit is set high and cal_code=[011000]. Suppose that this code also yields a CLK frequency that is lower than CLK_IN's frequency; then the 4$^{th}$ bit remains set high. On the following iteration, the 3$^{rd}$ bit is set high such that cal_code=[011100]. If this code results in a CLK frequency that is higher than CLK_IN's frequency, then the 3$^{rd}$ bit is cleared, i.e. cal_code=[011000]. Continuing to the next iteration, the 2$^{nd}$ bit is set high so cal_code=[011010]. Assuming that this code yields a CLK frequency lower than CLK_IN's frequency, then the 2$^{nd}$ bit remains set high. On the last iteration, the 1$^{st}$ bit is set high and cal_code=[011011]. If this code results in a CLK frequency that is higher than CLK_IN's frequency, then the 1$^{st}$ bit is cleared low, thus leaving the calibration code set to a final value of cal_code=[011010].

Because it is likely that the frequency of CLK_IN and the frequency of a calibrated CLK will not be exactly the same, triangle wave generator 1220 will not be precisely synchronized with CLK_IN. Even if there was no frequency error between the two clock signals, there may still be a phase shift between the two. In one embodiment, after calibration is complete, the triangle wave generator 1220 is driven with CLK_IN to synchronize the resultant triangle wave signal $V_{RAMP}$ with CLK_IN while maintaining minimal discontinuities.

Figure 17:
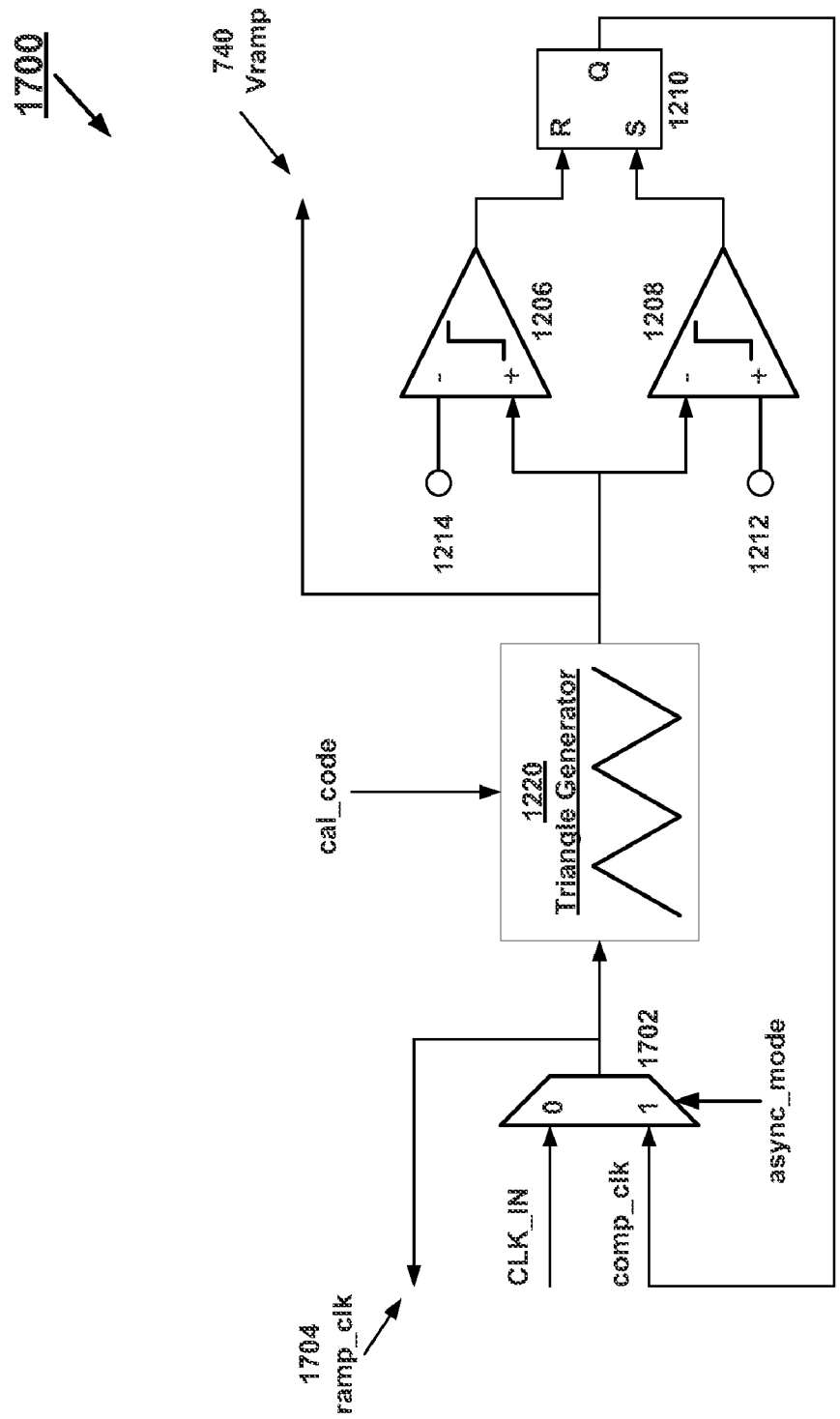
FIG. 17 shows an embodiment of a programmable triangle wave generator which can be switched to use an external clock signal.

FIG. 17 shows an embodiment of a programmable triangle wave generator that can be switched to be synchronized and driven by an external clock signal. Programmable triangle wave generator 1700 is similar to self-oscillating triangle wave generator 1200, but further comprises selection circuitry shown in this example by multiplexer 1702. During calibration, the multiplexer's input select is set to one and the internally generated clock signal comp_clk is used to drive triangle generator 1220. The output of the multiplexer, signal 1704, can be sent to the calibration circuitry. After calibration is complete, multiplexer 1702 can be set to select the external clock signal CLK_IN to drive triangle wave generator 1220, thus producing an output signal which is a triangle wave synchronized to CLK_IN.

Figure 18:
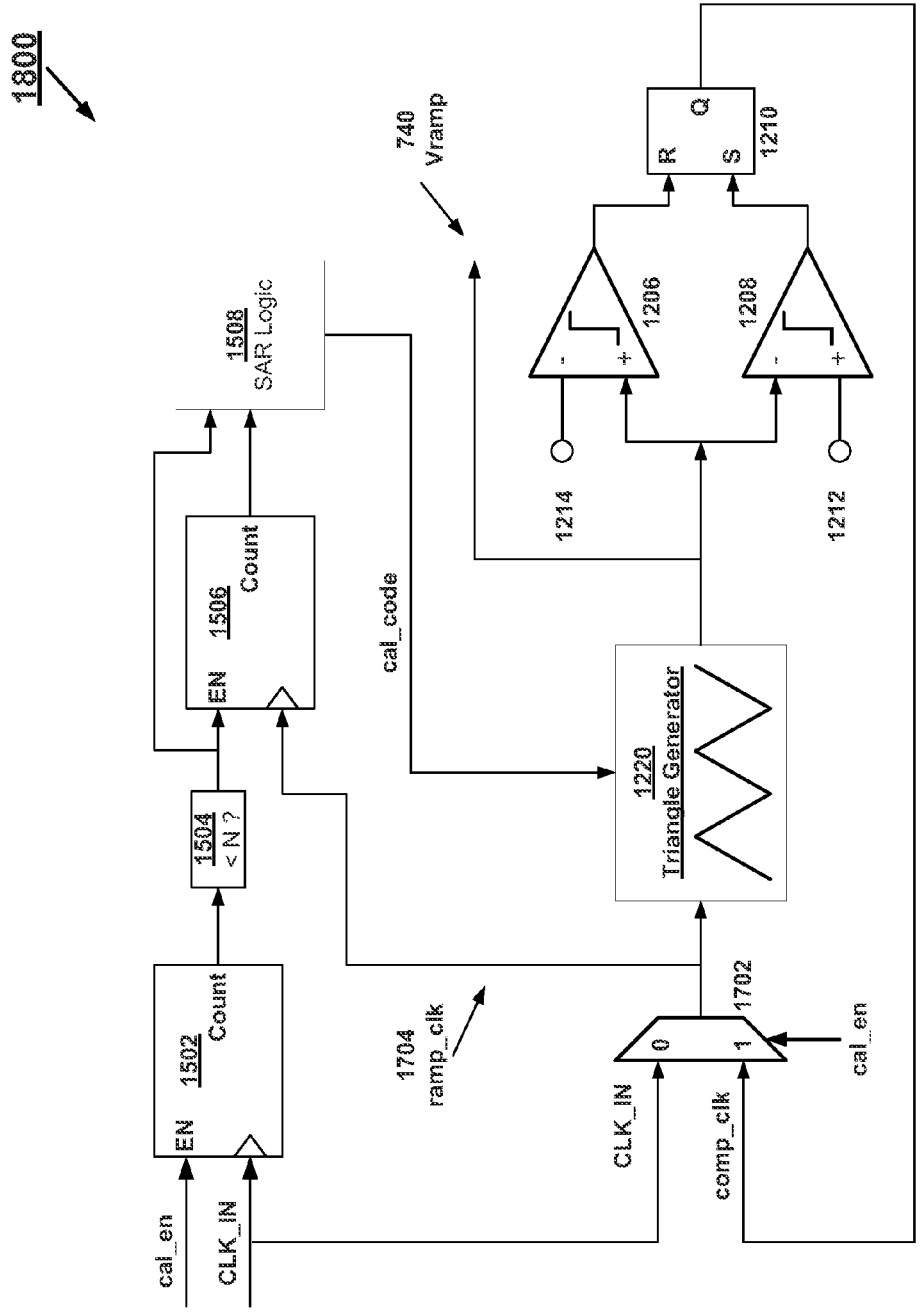
FIG. 18 shows an embodiment of the programmable triangle wave generator with calibration circuitry.

FIG. 18 shows an embodiment of the programmable triangle wave generator with calibration circuitry. The components are described previously in FIGS. 12, 15, and 17. In addition to the cal_en signal enabling calibration and controlling which clock signal drives triangle wave generator 1220, cal_en can also be used to indicate when calibration has completed. When the cal_en signal is in the low state, calibration is complete and the calibration circuitry as well as comparators 1206 and 1208 and latch 1210 can be disabled to save power.

Figure 19:
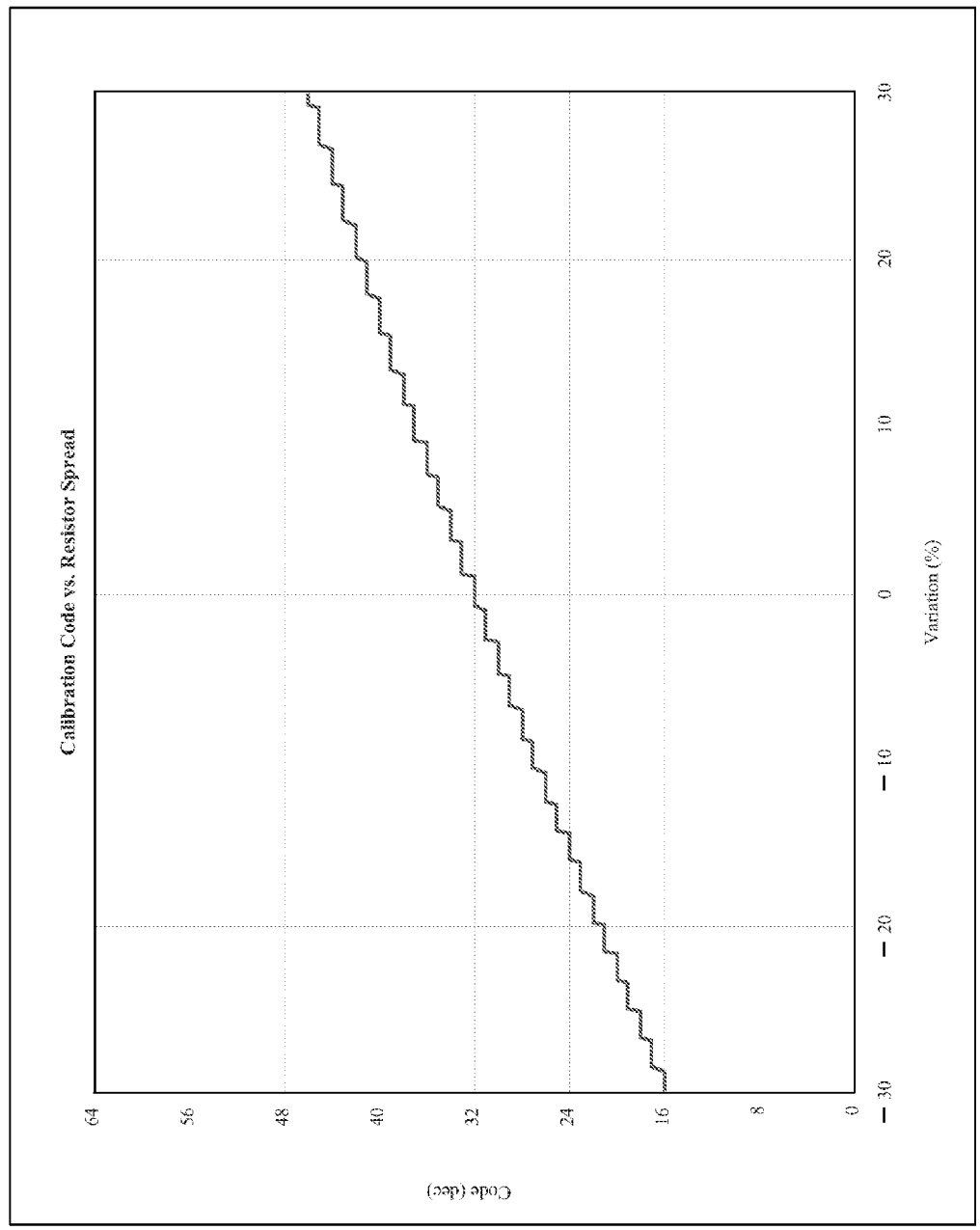
FIG. 19 shows how the calibration code varies versus the on-chip resistor variation.
Figure 20:
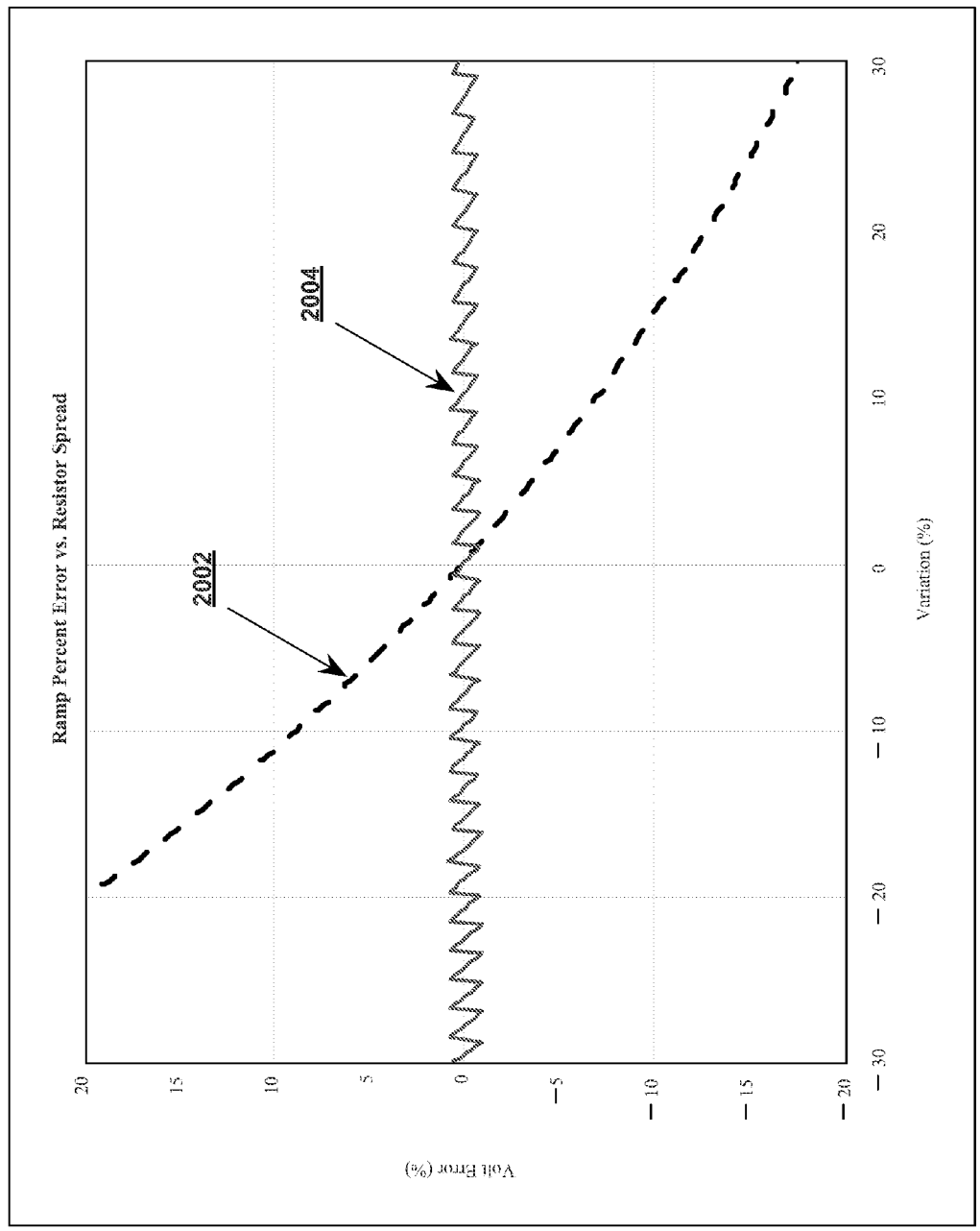
FIG. 20 plots the magnitude of the discontinuities normalized to ramp amplitude with and without calibration.

Simulation results of a calibration system employing a 6-bit current DAC are shown in FIGS. 19 and 20. FIG. 19 shows how the calibration code varied versus the on-chip resistor variation. The plot shows that the calibration was monotonic with variation, as expected. Under nominal conditions, cal_code=32 which was at the midpoint of its range (0-63). At high positive variations, on-chip resistance is higher than nominal; thus the ramp slope is lower than ideal. The calibration then correctly determined that a higher DAC current was needed to increase the ramp slope.

FIG. 20 plots the magnitude of the discontinuities normalized to ramp amplitude with and without calibration. A positive error indicates that the discontinuity is due to a ramp voltage that overshoots the bias voltages (see graph 906 of FIG. 9 for an example). A negative error indicates that the ramp voltage was lower than the bias voltages (see graph 908 of FIG. 9). The dashed trace 2002 shows how the voltage discontinuities of an uncalibrated ramp generator increase dramatically as process variation skews away from nominal. At high positive variations where the ramp slope is too low, the ramp voltage undershoots the ideal voltage by over 15%. Solid trace 2004 shows the magnitude of the discontinuities after calibration has been performed. The error is now bounded to less than 1.5% across the variation range.

Additional simulations on other variations such as temperature, frequency deviation, and capacitance show similar behavior. The calibration has the added benefit that it isn't sensitive to errors in the DAC. DAC offset or non-linearity is not of vital importance since the calibration logic's binary search will always seek out the optimal DAC setting from what is available. The only constraint on the DAC is that it be monotonic, which is easily achieved in practice.

The above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

What is claimed:

1. In a pulse modulator, a calibrated synchronized triangular waveform generator comprising:
    a triangular waveform generator including a clock input for receiving a clock signal and a calibration code input for receiving a calibration code signal, the triangular waveform generator operable to output a triangular waveform in response to the received clock signal and calibration code signal;
    a digital pulse generator configured to receive the triangular waveform and produce an internally generated clock signal sharing essentially a common frequency with the triangular waveform;
    a calibration circuit operable to adjust the calibration code signal by comparing a frequency of an external clock signal and the frequency of the internally generated clock signal during calibration; and
    clock selection circuitry selectively providing either the internally generated clock signal or the external clock signal to the clock input, wherein the internally generated clock signal is selected during calibration.

2. The pulse modulator of claim 1 wherein the clock selection circuitry comprises a multiplexer.

3. The calibrated synchronized triangle waveform generator of claim 1 wherein the digital pulse generator comprises:
    a latch operable to generate the internally generated clock signal, wherein the latch is set to a low state when a predetermined high bias voltage is lower than the triangular waveform voltage and set to a high state when a predetermined low bias voltage is higher than the triangular waveform voltage.

4. The calibrated synchronized triangle waveform generator of claim 3 wherein the digital pulse generator further comprises:
    a first comparator operable to compare the triangular waveform voltage with the high bias voltage and output a result to the latch; and
    a second comparator operable to compare the triangular waveform voltage with the low bias voltage and output a result to the latch.

5. The calibrated synchronized triangular waveform generator of claim 1, wherein the calibration circuit and the digital pulse generator arc deactivated when the calibrated synchronized triangular waveform generator is not in calibration.

6. The calibrated synchronized triangular waveform generator of claim 1, wherein the calibration circuit comprises:
    a rate comparison circuit operable to compare a first number of cycles of the external clock signal and a second number of cycles of the internally generated clock signal;
    a successive approximation register operable to adjust the calibration code on the basis of whether the first number is greater than the second number.

7. The calibrated synchronized triangular waveform generator of claim 6, wherein the rate comparison circuit comprises:
    a first counter operable to count the first number;
    a second counter operable to count the second number, wherein the second counter stops counting when the first counter counts a predetermined number of cycles.

8. The calibrated synchronized triangular waveform generator of claim 1, the triangular waveform generator comprises:

a rising sawtooth waveform generator operable to produce a rising sawtooth waveform;
a falling sawtooth waveform generator operable to produce a falling sawtooth waveform; and
complementary switching circuits operable to alternatively output one of the rising sawtooth waveform and the falling sawtooth waveform to generate the triangular waveform.

9. The pulse modulator of claim 8 wherein each sawtooth waveform generator further comprises:
a capacitor; and
an adjustable current source for charging the capacitor, wherein the output of the adjustable current source is controlled by the calibration code.

10. A method of generating a triangular waveform synchronized to an external clock signal comprising:
generating a triangular waveform having a voltage on the basis of a calibration code signal and a clock signal;
during calibration, selecting an internally generated clock signal as the clock signal;
during calibration, generating the internally generated clock signal wherein the internally generated clock signal and the generated triangular waveform essentially share a common frequency;
during calibration, adjusting the calibration code signal on the basis of the external clock signal and the internally generated clock signal; and
after calibration, freezing the calibration code signal;
wherein adjusting the calibration code signal comprises:
comparing a first number of cycles of the external clock signal with a second number of cycles of the internally clock signal; and
refining an approximation to a calibration code on the basis of whether the first number is greater than the second number.

11. The method of claim 10, wherein generating the internally generated clock signal comprises:
comparing the voltage of the triangular waveform with a high bias voltage and forcing the internally generated clock signal into a low state when the voltage is greater than or equal to the high b as voltage; and
comparing the voltage of the triangular waveform with a low bias voltage and forcing the internally generated clock signal into a high state when the voltage is less than or equal to the low bias voltage.

12. The method of claim 11, wherein the calibration code comprises b bits and refining the approximation comprises:
setting n to b; and
repeating while n is greater than 1, an iteration comprising:
setting the nth bit in the calibration code; and
if the second number is greater than the first number then clearing the nth bit in the calibration code.

13. The method of claim 11, wherein the comparing comprises:
counting, the first number of cycles;
counting the second number of cycles until the first number of cycles reaches a predetermined number of cycles.

14. The method of claim 10 wherein generating a triangular waveform comprises:
when the clock signal is in the high state generating a rising sawtooth waveform having a voltage with a slope controlled by the calibration code signal; and
when the clock signal is in the low state generating a falling sawtooth waveform having a voltage with a slope controlled by the calibration code signal.

15. A calibrated triangular waveform generator synchronized to an external clock signal comprising:

means for generating a triangular waveform having a voltage on the basis of a calibration code signal and a clock signal;
means for selecting an internally generated clock signal as the clock signal;
means for generating the internally generated clock signal comprising:
means for comparing the voltage of the triangular waveform with a high bias voltage and forcing the internally generated clock signal into a low state when the voltage is greater than or equal to the high bias voltage; and
means for comparing the voltage of the triangular waveform with a low bias voltage and forcing the internally generated clock signal into a high state when the voltage is less than or equal to the low bias voltage;
means for adjusting the calibration code signal on the basis of the external clock signal and the internally generated clock signal, the means for adjusting further comprising:
means for comparing a first number of cycles of the external clock signal with a second number of cycles of the internally clock signal; and
means for refining an approximation to a calibration code on the basis of whether the first number is greater than the second number; and
means for freezing the calibration code signal.

16. The calibrated triangular waveform generator of claim 15, further comprising means for deactivating the means for generating the internally generated clock signal and the means for adjusting the calibration code signal after calibration.

17. The calibrated triangular waveform generator of claim 15 wherein generating a triangular waveform comprises:
means for generating a rising sawtooth waveform having a voltage with a slope controlled by the calibration code signal;
means for generating a falling sawtooth waveform having a voltage with a slope controlled by the calibration code signal; and
switching means for selecting the means for generating a rising sawtooth waveform and the means for generating a falling sawtooth on the basis of the clock signal.

18. A waveform generator comprising:
a triangular waveform generator including a clock input for receiving a clock signal and a calibration code input for receiving a calibration code signal, the triangular waveform generator operable to output a triangular waveform in response to the received clock signal and calibration code signal;
a digital pulse generator configured to receive the triangular waveform and produce an internally generated clock signal sharing essentially a common frequency with the triangular waveform; and
a calibration circuit operable to adjust the calibration code signal by comparing a frequency of an external clock signal and the frequency of the internally generated clock signal during calibration, the calibration circuit comprising:
a rate comparison circuit operable to compare a first number of cycles of the external clock signal and a second number of cycles of the internally clock signal;
a successive approximation register operable to adjust the calibration code on the basis of whether the first number is greater than the second number.

19. The waveform generator of claim 18 further comprising clock selection circuitry selectively providing either the internally generated clock signal or the external clock signal to the clock input, wherein the internally generated clock signal is selected during calibration.

20. The waveform generator of claim 18 wherein the digital pulse generator comprises a latch operable to generate the internally generated clock signal, wherein the latch is set to a low state when a predetermined high bias voltage is lower than the triangular waveform voltage and set to a high state when a predetermined low bias voltage is higher than the triangular waveform voltage.

21. The waveform generator of claim 20 wherein the digital pulse generator further comprises:
    a first comparator operable to compare the triangular waveform voltage with the high bias voltage and output the result to the latch; and
    a second comparator operable to compare the triangular waveform voltage with the low bias voltage and output the result to the latch.

22. The waveform generator of claim 18, wherein the rate comparison circuit comprises:
    a first counter operable to count the first number;
    a second counter operable to count the second number, wherein the second counter stops counting when the first counter counts a predetermined number of cycles.

23. A waveform generator comprising:
    a triangular waveform generator including a clock input for receiving a clock signal and a calibration code input for receiving a calibration code signal, the triangular waveform generator operable to output a triangular waveform in response to the received clock signal and calibration code signal, the triangular waveform generator further comprising:
        a rising sawtooth waveform generator operable to produce a rising sawtooth waveform;
        a falling sawtooth waveform generator operable to produce a falling sawtooth waveform; and
        complementary switching circuits operable to alternatively output one of the rising sawtooth waveform and the falling sawtooth waveform to generate the triangular waveform; and
    wherein each sawtooth waveform generator further comprises:
        a capacitor: and
        an adjustable current source for charging the capacitor. wherein the out-put of the adjustable current source is controlled by the calibration code;
    a digital pulse generator configured to receive the triangular waveform and produce an internally generating clock signal sharing essentially a common frequency with the triangular waveform; and
    a calibration circuit operable to adjust the calibration code signal by comparing the frequency of an external clock signal and the frequency of the internally generated clock signal during calibration.

* * * * *

UNITED STATES PATENT AND TRADEMARK OFFICE
CERTIFICATE OF CORRECTION

| | | |
|---|---|---|
| PATENT NO. | : 8,044,690 B2 | |
| APPLICATION NO. | : 12/574663 | |
| DATED | : October 25, 2011 | |
| INVENTOR(S) | : Ketan B. Patel, Lorenzo Crespi and Lakshmi P. Murukutla | |

It is certified that error appears in the above-identified patent and that said Letters Patent is hereby corrected as shown below:

Column 10, line 15, replace "sharing essentially" with "essentially sharing"

Column 10, line 27, replace "triangle" with "triangular"

Column 10, line 35, replace "triangle" with "triangular"

Column 10, line 46, replace "arc" with "are"

Column 10, lines 55-56, replace "the calibration code" with "a calibration code"

Column 11, lines 31-32, replace "internally clock signal" with "internally generated clock signal"

Column 11, line 41, replace "b as" with "bias"

Column 12, line 22, replace "internally clock signal" with "internally generated clock signal"

Column 12, line 52, replace "sharing essentially" with "essentially sharing"

Column 12, lines 61-62, replace "internally clock signal" with "internally generated clock signal"

Column 14, line 16, replace ":" with ";"

Column 14, line 17, replace "." with ","

Signed and Sealed this
Twentieth Day of December, 2011

David J. Kappos
*Director of the United States Patent and Trademark Office*